(12) United States Patent
Narushima et al.

(10) Patent No.: US 10,829,854 B2
(45) Date of Patent: Nov. 10, 2020

(54) FILM FORMING METHOD

(71) Applicant: TOKYO ELECTRON LIMITED, Tokyo (JP)

(72) Inventors: Kensaku Narushima, Nirasaki (JP); Katsumasa Yamaguchi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 73 days.

(21) Appl. No.: 15/897,732

(22) Filed: Feb. 15, 2018

(65) Prior Publication Data

US 2018/0237911 A1    Aug. 23, 2018

(30) Foreign Application Priority Data

Feb. 22, 2017  (JP) .................. 2017-030762

(51) Int. Cl.
| | | |
|---|---|---|
| *C23C 16/455* | (2006.01) | |
| *C23C 16/14* | (2006.01) | |
| *C23C 16/02* | (2006.01) | |
| *C23C 16/08* | (2006.01) | |

(52) U.S. Cl.
CPC .... *C23C 16/45527* (2013.01); *C23C 16/0272* (2013.01); *C23C 16/08* (2013.01); *C23C 16/14* (2013.01)

(58) Field of Classification Search
CPC ... C23C 16/45527; C23C 16/08; C23C 16/14; C23C 16/45525; C23C 16/0272
See application file for complete search history.

(56) References Cited

U.S. PATENT DOCUMENTS

| | | | |
|---|---|---|---|
| 2016/0047047 A1* | 2/2016 | Moroi ................ | C23C 16/52 118/712 |
| 2016/0208382 A1* | 7/2016 | Takahashi ......... | C23C 16/45544 |
| 2016/0233099 A1* | 8/2016 | Narushima ....... | H01L 21/28556 |
| 2016/0284553 A1* | 9/2016 | Suzuki ............. | H01L 21/76883 |

FOREIGN PATENT DOCUMENTS

| | | | |
|---|---|---|---|
| JP | 2004-273764 | * | 9/2004 |
| JP | 2008-60603 A | | 3/2008 |
| JP | 2016-145409 A | | 8/2016 |
| JP | 2016-186094 A | | 10/2016 |
| KR | 1020160115781 A | | 10/2016 |

* cited by examiner

*Primary Examiner* — Elizabeth A Burkhart

(74) *Attorney, Agent, or Firm* — Nath, Goldberg & Meyer; Jerald L. Meyer

(57) ABSTRACT

There is provided a film forming method of forming a metal film, which includes: alternately supplying a metal chloride gas and a reducing gas for reducing the metal chloride gas to a substrate arranged inside a processing vessel a plurality of times, wherein the alternately supplying the metal chloride gas and the reducing gas includes a period of time during which a flow rate of the metal chloride gas gradually increases.

12 Claims, 7 Drawing Sheets

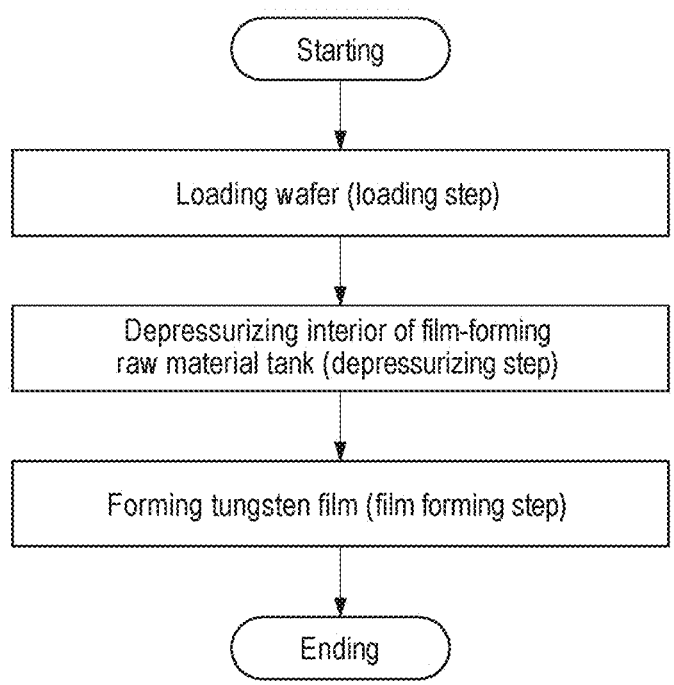

FIG. 7
| | Example | Comparative example |
|---|---|---|
| TOP | 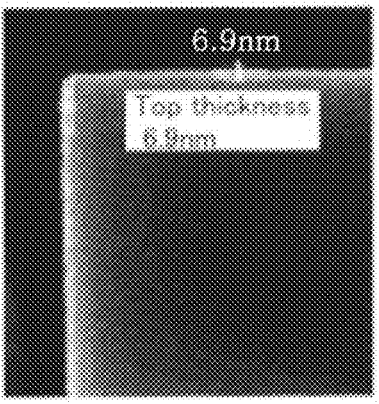 6.9nm | 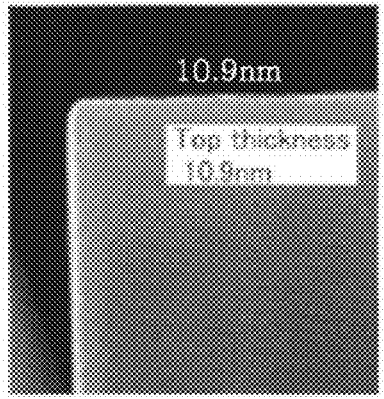 10.9nm |
| BTM | 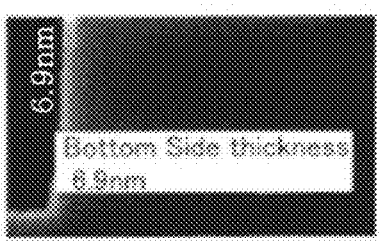 6.9nm | 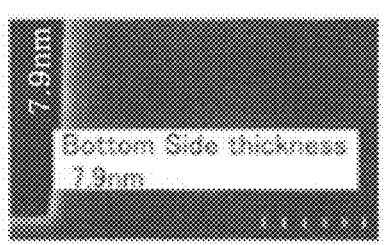 7.9nm |

FILM FORMING METHOD

CROSS-REFERENCE TO RELATED APPLICATION

This application is based upon and claims the benefit of priority from Japanese Patent Application No. 2017-030762, filed on Feb. 22, 2017, the entire contents of which are incorporated herein by reference.

TECHNICAL FIELD

The present disclosure relates to a film forming method.

BACKGROUND

When manufacturing LSI, a tungsten film is widely used for MOSFET gate electrode contact with source/drain, word line of memory, and the like. The tungsten film is formed by, for example, a physical vapor deposition (PVD) method, a chemical vapor deposition (CVD) method, or an atomic layer deposition (ALD) method. Among them, when high coverage (step coverage) is required, the ALD method is used.

When a tungsten film is formed by the ALD method, for example, a tungsten hexafluoride ($WF_6$) gas is used as a raw material gas and an $H_2$ gas is used as a reducing gas. However, in the case of forming the tungsten film using the $WF_6$ gas, fluorine contained in the $WF_6$ gas may reduce a gate insulating film in a semiconductor device, particularly in the gate electrode, the word line of the memory or the like, thereby deteriorating electrical properties.

As a raw material gas that does not contain fluorine, for example, tungsten hexachloride ($WCl_6$) is known. Similar to fluorine, chlorine also has reducing properties, but its reactivity is weaker than that of fluorine. Thus, chlorine is expected to have little adverse effect on electrical properties.

If the tungsten film is formed by an ALD method, however, since the adhesion to an oxide film such as an interlayer insulating film is poor and the incubation time is also long, it is difficult to form the film. For this reason, a Ti-based material film such as a TiN film is used as a base film.

However, a tungsten chloride gas used as a tungsten raw material has the property of etching the Ti-based material film which is the base film. As such, when the tungsten film is formed, the Ti-based material film as the base film is etched, which may be thinner than the required film thickness.

SUMMARY

The present disclosure provides some embodiments of a film forming method capable of forming a metal film while suppressing etching of a base film.

According to one embodiment of the present disclosure, there is provided a film forming method of forming a metal film, which includes: alternately supplying a metal chloride gas and a reducing gas for reducing the metal chloride gas to a substrate arranged inside a processing vessel a plurality of times, wherein the alternately supplying the metal chloride gas and the reducing gas includes a period of time during which a flow rate of the metal chloride gas gradually increases.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a flowchart illustrating the film forming method according to the present embodiment.

FIG. 7 is a diagram illustrating step coverage of a tungsten film in an Example and a Comparative example.

DETAILED DESCRIPTION

Figure 1:
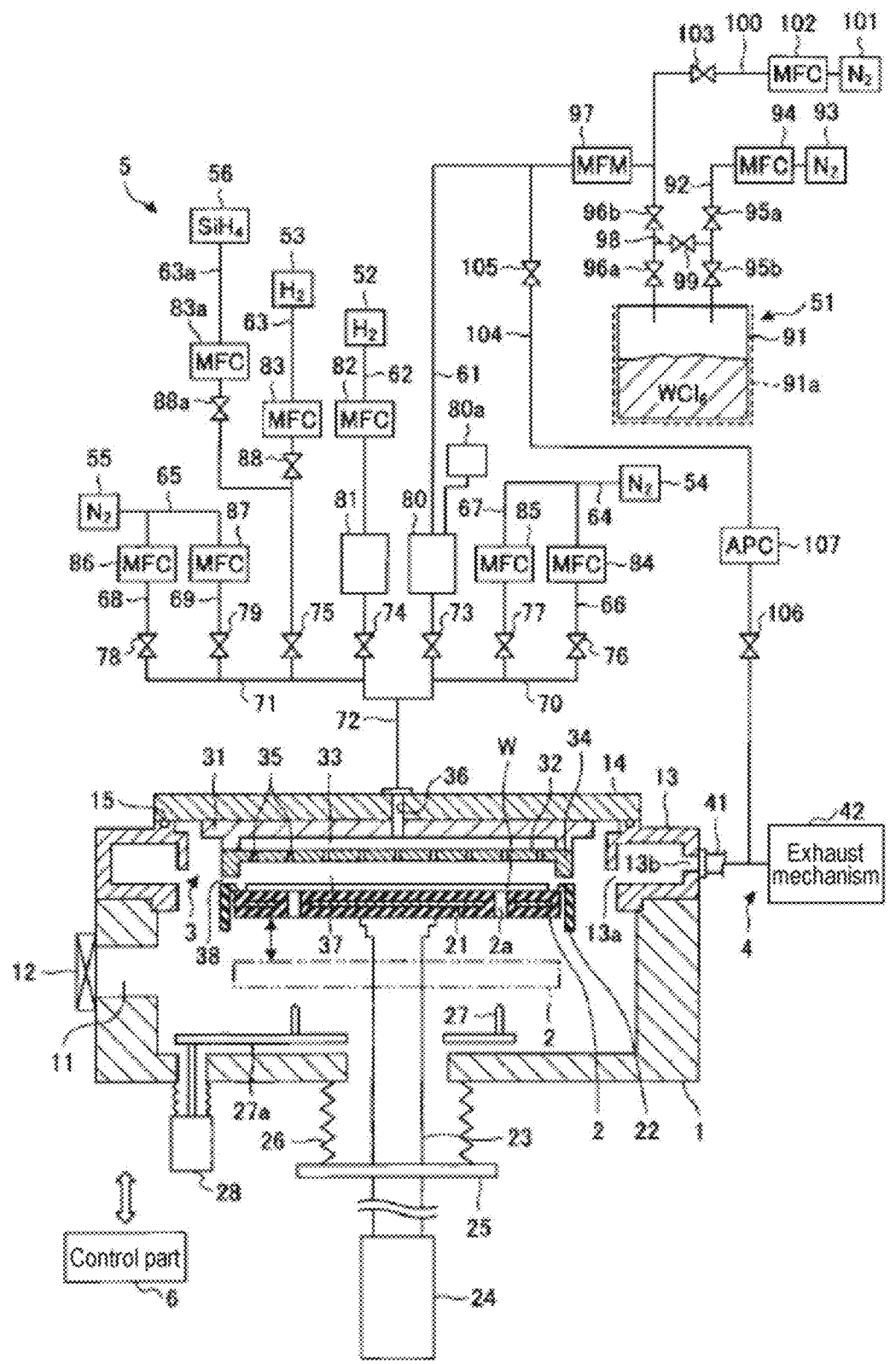
FIG. 1 is a schematic cross sectional view illustrating an example of a film forming apparatus used for implementing a film forming method according to an embodiment of the present disclosure.

Hereinafter, embodiments for implementing the present disclosure will be described with reference to the drawings. Further, in the present specification and the drawings, substantially the same components will be denoted by the same reference numerals, and redundant descriptions thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Film Forming Apparatus]

FIG. 1 is a schematic cross sectional view illustrating an example of a film forming apparatus used for implementing a film forming method according to an embodiment of the present disclosure. The film forming apparatus according to the present embodiment is configured as an apparatus that can form a film by an atomic layer deposition (ALD) method and a chemical vapor deposition (CVD) method.

The film forming apparatus includes a processing vessel 1, a susceptor 2 for horizontally supporting a semiconductor wafer (hereinafter, simply referred to as a "wafer" W) as a substrate inside the processing vessel 1, a shower head 3 for supplying a processing gas into the processing vessel 1 in the form of a shower, an exhaust part 4 for exhausting the interior of the processing vessel 1, a processing gas supply mechanism 5 for supplying the processing gas to the shower head 3, and a control part 6.

The processing vessel 1 is made of metal such as aluminum, and has a substantially cylindrical shape. A loading/unloading port 11 for loading and unloading the wafer W therethrough is formed in a sidewall of the processing vessel 1. The loading/unloading port 11 is configured to be opened and closed by a gate valve 12. An annular exhaust duct 13 having a rectangular cross section is installed on a main body of the processing vessel 1. A slit 13a is formed along an inner peripheral surface of the exhaust duct 13. In addition, an exhaust port 13b is formed in an outer wall of the exhaust duct 13. A ceiling wall 14 is installed on an upper surface of the exhaust duct 13 so as to close an upper opening of the processing vessel 1. A seal ring 15 is hermetically sealed between the ceiling wall 14 and the exhaust duct 13.

The susceptor 2 has a disk shape having a size corresponding to the wafer W, and is supported by a support member 23. The susceptor 2 is made of a ceramic material such as aluminum nitride (AlN) or a metal material such as an aluminum or nickel-based alloy. A heater 21 for heating the wafer W is embedded in the susceptor 2. The heater 21 generates heat based on power supplied from a heater power source (not shown). The wafer W is controlled to have a prescribed temperature by controlling an output of the heater 21 based on a temperature signal of a thermocouple (not shown) installed around a wafer mounting surface defined in the upper surface of the susceptor 2.

A cover member 22 made of ceramic such as alumina is installed in the susceptor 2 so as to cover an outer peripheral region of the wafer mounting surface and a side surface of the susceptor 2.

The support member 23 supporting the susceptor 2 extends from the center of a bottom surface of the susceptor 2 to a lower side of the processing vessel 1 through a hole portion formed in a bottom wall of the processing vessel 1. A lower end of the support member 23 is connected to an elevating mechanism 24. The susceptor 2 is configured to be moved up and down by the elevating mechanism 24 between a processing position shown in FIG. 1 and a transfer position where the wafer is transferable as indicated by the dashed double-dotted line below the processing position, while being supported by the support member 23. Furthermore, a flange portion 25 is installed in a lower side of the support member 23 below the processing vessel 1. A bellows 26 configured to isolate an internal atmosphere of the processing vessel 1 from ambient air and to be flexible with the vertical movement of the susceptor 2 is installed between the bottom surface of the processing vessel 1 and the flange portion 25.

Three wafer support pins 27 (here, only two are shown) are installed near the bottom surface of the processing vessel 1 so as to protrude upward from an elevating plate 27a. The wafer support pins 27 can be lifted and lowered by an elevating mechanism 28 installed below the processing vessel 1 through the elevating plate 27a. The wafer support pins 27 are inserted into respective through holes 2a installed in the susceptor 2 at the transfer position and can be moved upward and downward on the upper surface of the susceptor 2. By lifting and lowering the wafer support pins 27 in this manner, the wafers W are transferred between the wafer transfer mechanism (not shown) and the susceptor 2.

The shower head 3 is made of metal and is installed so as to face the susceptor 2. The shower head 3 has substantially the same diameter as that of the susceptor 2. The shower head 3 includes a body section 31 fixed to the ceiling wall 14 of the processing vessel 1 and a shower plate 32 installed below the body section 31. A gas diffusion space 33 is formed between the body section 31 and the shower plate 32. A gas introduction hole 36 is formed in the gas diffusion space 33 so as to penetrate the body section 31 and the center of the ceiling wall 14 of the processing vessel 1. An annular projection 34 protruding downward is formed in a peripheral edge portion of the shower plate 32. Gas discharge holes 35 are formed in an inner flat surface of the annular projection 34 of the shower plate 32.

When the susceptor 2 is located at the processing position, a process space 37 is defined between the shower plate 32 and the susceptor 2, and the annular projection 34 and the upper surface of the cover member 22 are brought close to each other to form an annular clearance 38.

The exhaust part 4 includes an exhaust pipe 41 connected to the exhaust port 13b of the exhaust duct 13 and an exhaust mechanism 42 equipped with a vacuum pump, a pressure control valve and the like, and connected to the exhaust pipe 41. During the processing, the gas within the processing vessel 1 reaches the exhaust duct 13 via the slit 13a, and is exhausted from the exhaust duct 13 via the exhaust pipe 41 by the exhaust mechanism 42 of the exhaust part 4.

The processing gas supply mechanism 5 includes a $WCl_6$ gas supply mechanism 51, a first $H_2$ gas supply source 52, a second $H_2$ gas supply source 53, a first $N_2$ gas supply source 54, a second $N_2$ gas supply source 55, and an $SiH_4$ gas supply source 56. The $WCl_6$ gas supply mechanism 51 supplies a $WCl_6$ gas as a metal chloride gas which is a raw material gas. The first $H_2$ gas supply source 52 supplies an $H_2$ gas as a reducing gas. The second $H_2$ gas supply source 53 supplies an $H_2$ gas as an additive reducing gas. The first $N_2$ gas supply source 54 and the second $N_2$ gas supply source 55 supply an $N_2$ gas as a purge gas. The $SiH_4$ gas supply source 56 supplies an $SiH_4$ gas.

In addition, the processing gas supply mechanism 5 includes a $WCl_6$ gas supply line 61, a first $H_2$ gas supply line 62, a second $H_2$ gas supply line 63, a first $N_2$ gas supply line 64, a second $N_2$ gas supply line 65, and an $SiH_4$ gas supply line 63a. The $WCl_6$ gas supply line 61 is a line extending from the $WCl_6$ gas supply mechanism 51. The first $H_2$ gas supply line 62 is a line extending from the first $H_2$ gas supply source 52. The second $H_2$ gas supply line 63 is a line extending from the second $H_2$ gas supply source 53. The first $N_2$ gas supply line 64 is a line which extends from the first $N_2$ gas supply source 54 and supplies the $N_2$ gas to the side of the $WCl_6$ gas supply line 61. The second $N_2$ gas supply line 65 is a line which extends from the second $N_2$ gas supply source 55 and supplies the $N_2$ gas to the side of the first $H_2$ gas supply line 62. The $SiH_4$ gas supply line 63a is a line which extends from the $SiH_4$ gas supply source 56 and is installed to be connected to the second $H_2$ gas supply line 63

The first $N_2$ gas supply line 64 is branched into a first continuous $N_2$ gas supply line 66 through which the $N_2$ gas is supplied at all times during film formation by the ALD method, and a first flash purge line 67 through which the $N_2$ gas is supplied only during a purging step. Furthermore, the second $N_2$ gas supply line 65 is branched into a second continuous $N_2$ gas supply line 68 through which the $N_2$ gas is supplied at all times during the film formation by the ALD method, and a second flash purge line 69 through which the $N_2$ gas is supplied only during the purging step. In addition, the first continuous $N_2$ gas supply line 66 and the first flash purge line 67 are connected to a first connection line 70. The first connection line 70 is connected to the $WCl_6$ gas supply line 61. The second $H_2$ gas supply line 63, the second continuous $N_2$ gas supply line 68, and the second flash purge line 69 are connected to a second connection line 71. The second connection line 71 is connected to the first $H_2$ gas supply line 62. The $WCl_6$ gas supply line 61 and the first $H_2$ gas supply line 62 are joined in a join pipe 72. The join pipe 72 is connected to the aforementioned gas introduction hole 36.

Opening/closing valves 73, 74, 75, 76, 77, 78, and 79 for switching a gas during ALD are installed at the most downstream sides of the $WCl_6$ gas supply line 61, the first $H_2$ gas supply line 62, the second $H_2$ gas supply line 63, the first continuous $N_2$ gas supply line 66, the first flash purge line 67, the second continuous $N_2$ gas supply line 68, and the second flash purge line 69, respectively. In addition, mass flow controllers 82, 83, 84, 85, 86, and 87 as flow rate controllers are installed at the upstream sides of the respective opening/closing valves of the first $H_2$ gas supply line 62, the second $H_2$ gas supply line 63, the first continuous $N_2$ gas supply line 66, the first flash purge line 67, the second continuous $N_2$ gas supply line 68, and the second flash purge line 69, respectively. The mass flow controller 83 is installed at an upstream side of the second $H_2$ gas supply line 63 toward a joint where the $SiH_4$ gas supply line 63a is connected to the second $H_2$ gas supply line 63. An opening/closing valve 88 is installed between the mass flow controller 83 and the joint. Furthermore, a mass flow controller 83a and an opening/closing valve 88a are installed in the $SiH_4$ gas supply line 63a sequentially from the upstream side. Thus, either or both of the $H_2$ gas and the $SiH_4$ gas can be supplied via the second $H_2$ gas supply line 63. Buffer tanks 80 and 81 are respectively installed in the $WCl_6$ gas supply line 61 and the first $H_2$ gas supply line 62 so that an appropriate gas can be supplied in a short period of time. A manometer 80a configured to detect an internal pressure of the buffer tank 80 is installed in the buffer tank 80.

The $WCl_6$ gas supply mechanism 51 includes a film-forming raw material tank 91 as a raw material vessel for storing $WCl_6$. $WCl_6$ is a solid raw material that is solid at room temperature. A heater 91a is installed around the film-forming raw material tank 91 so that a film-forming raw material within the film-forming raw material tank 91 is heated to a proper temperature to sublimate $WCl_6$. The aforementioned $WCl_6$ gas supply line 61 is inserted into the film-forming raw material tank 91 from above.

In addition, the $WCl_6$ gas supply mechanism 51 includes a carrier gas pipe 92 inserted into the film-forming raw material tank 91 from above, a carrier $N_2$ gas supply source 93 for supplying the $N_2$ gas as a carrier gas to the carrier gas pipe 92, a mass flow controller 94 as a flow rate controller connected to the carrier gas pipe 92, opening/closing valves 95a and 95b installed at the downstream side of the mass flow controller 94, and opening/closing valves 96a and 96b and a flowmeter 97 installed near the film-forming raw material tank 91 in the $WCl_6$ gas supply line 61. In the carrier gas pipe 92, the opening/closing valve 95a is installed at a position directly below the mass flow controller 94, and the opening/closing valve 95b is installed at an insertion end side of the carrier gas pipe 92. Furthermore, the opening/closing valves 96a and 96b and the flowmeter 97 are arranged in the named order from the insertion end of the $WCl_6$ gas supply line 61.

A bypass pipe 98 is installed so as to connect a position between the opening/closing valve 95a and the opening/closing valve 95b of the carrier gas pipe 92 and a position between the opening/closing valve 96a and the opening/closing valve 96b of the $WCl_6$ gas supply line 61. An opening/closing valve 99 is installed in the bypass pipe 98. By closing the opening/closing valves 95b and 96a and opening the opening/closing valves 99, 95a and 96b, the $N_2$ gas supplied from the carrier $N_2$ gas supply source 93 is supplied to the $WCl_6$ gas supply line 61 through the carrier gas pipe 92 and the bypass pipe 98. Thus, the $WCl_6$ gas supply line 61 can be purged.

Furthermore, an end portion at the downstream side of a dilution $N_2$ gas supply line 10) for supplying the $N_2$ gas as a dilution gas joins the upstream side of the flowmeter 97 in the $WCl_6$ gas supply line 61. A dilution $N_2$ gas supply source 101 serving as a supply source of the $N_2$ gas is installed at an end portion at the upstream side of the dilution $N_2$ gas supply line 100. A mass flow controller 102 and an opening/closing valve 103 are installed in the dilution $N_2$ gas supply line 100 from the corresponding upstream side.

One end of an evac line 104 is connected to a downstream position of the flowmeter 97 in the $WCl_6$ gas supply line 61, and the other end of the evac line 104 is connected to the exhaust pipe 41. An opening/closing valve 105 and an opening/closing valve 106 are installed at a position near the $WCl_6$ gas supply line 61 in the evac line 104 and at a position near the exhaust pipe 41, respectively. A pressure control valve 107 is also installed between the opening/closing valve 105 and the opening/closing valve 106. Then, the interior of the film-forming raw material tank 91 and the interior of the buffer tank 80 can be exhausted by the exhaust mechanism 42 by opening the opening/closing valves 105, 106, 96a and 96b while closing the opening/closing valves 99, 95a, and 96b.

The control part 6 includes a process controller equipped with a microprocessor (computer) that controls the respective components, specifically the valves, the power supplies, the heater, the pump and the like, a user interface, and a storage part. Each component of the film forming apparatus is electrically connected to the process controller so as to be controlled. The user interface is connected to the process controller, and includes a keyboard that causes an operator to execute input operations of commands in order to manage each component of the film forming apparatus, a display that visually displays an operation status of each component of the film forming apparatus, and the like. The storage part is also connected to the process controller. The storage part stores a control program for realizing various processes to be executed by the film forming apparatus under the control of the process controller, a control program that causes each component of the film forming apparatus to execute a predetermined process according to the processing conditions, namely a process recipe, various databases, or the like. The process recipe is stored in a storage medium (not shown) in the storage part. The storage medium may be one that is fixedly installed such as a hard disk, or one that is portable such as a CDROM, a DVD, or a semiconductor memory. Also, the recipe may be appropriately transmitted from another device, for example, via a dedicated line. If necessary, a predetermined process recipe may be called from the storage part according to an instruction provided from the user interface and then executed by the process controller so that a desired process is performed in the film forming apparatus under the control of the process controller.

[Film Forming Method]

A method of forming a tungsten film using the aforementioned film forming apparatus will be described. The film forming method according to the present embodiment is applied to, for example, a case where a tungsten film is formed on a wafer W in which a base film is formed on a surface of a silicon film having a recess such as a trench or hole.

Figure 3A:
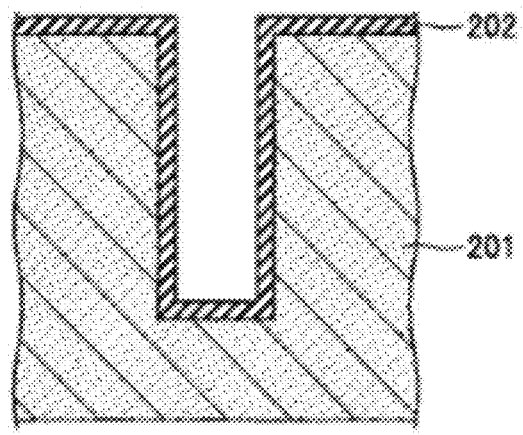
FIGS. 3A and 3B are schematic cross sectional views when a tungsten film is formed on a TiN film.
Figure 3B:
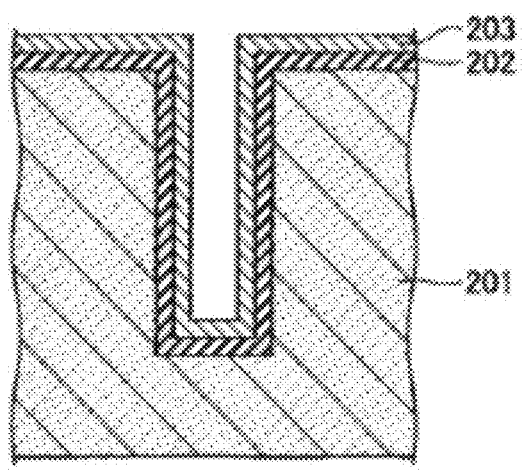
Figure 4:
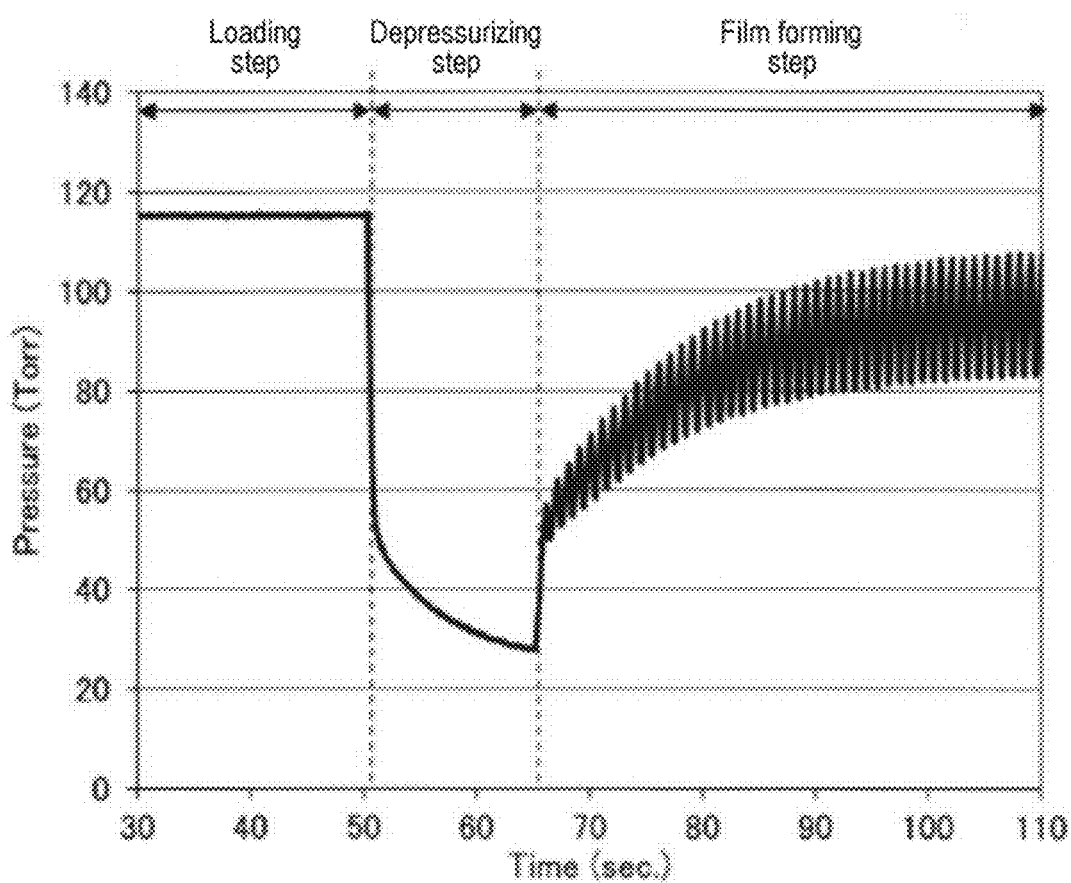
FIG. 4 is a diagram illustrating a relationship between an elapsed time and an internal pressure of a buffer tank.

FIG. 2 is a flowchart illustrating a film forming method according to the present embodiment. FIGS. 3A and 3B are schematic cross sectional views when a tungsten film is formed on a TiN film. FIG. 4 is a diagram illustrating a relationship between an elapsed time and an internal pressure of the buffer tank. In FIG. 4, the horizontal axis represents an elapsed time (sec), and the vertical axis represents an internal pressure (Torr) of the buffer tank.

First, a wafer W is loaded into a processing vessel 1 (loading step). Specifically, in a state where the susceptor 2 is moved down to the transfer position, the gate valve 12 is opened, and the wafer W is loaded into the processing vessel 1 via the loading/unloading port 11 by the transfer device (not shown) and is mounted on the susceptor 2 heated to a predetermined temperature by the heater 21. Subsequently, the susceptor 2 is moved up to the processing position and the interior of the processing vessel 1 is depressurized to a predetermined degree of vacuum. Thereafter, the opening/closing valves 76 and 78 are opened, and the opening/closing valves 73, 74, 75, 77, and 79 are closed. Thus, the $N_2$ gas is supplied from the first $N_2$ gas supply source 54 and the second $N_2$ gas supply source 55 into the processing vessel 1 via the first continuous $N_2$ gas supply line 66 and the second continuous $N_2$ gas supply line 68 to increase the pressure and to stabilize the temperature of the wafer W mounted on the susceptor 2. At this time, as illustrated in FIG. 4, the $WCl_6$ gas is supplied from the film-forming raw material tank 91 into the buffer tank 80 so that the internal pressure of the buffer tank 80 is maintained to be substantially constant. In the present embodiment, the internal pressure of the buffer tank 80 is maintained at 115 Torr ($1.5 \times 10^4$ Pa). As the wafer W, as illustrated in FIG. 3A it may be possible to use, for example, a wafer in which a base film 202 is formed on a surface of a silicon film 201 having a recess such as a trench or hole. The base film 202 may include a titanium-based material film such as a TiN film, a TiSiN film, a Ti silicide film, a Ti film, a TiO film, or a TiAlN film. Also, the base film 202 may include a tungsten-based compound film such as a WN film a $WSi_X$ film, or a WSiN film. By forming the base film 202 on the surface of the silicon film 201, it is possible to form the tungsten film with good adhesion. In addition, the incubation time can be shortened.

Subsequently, the interior of the film-forming raw material tank 91 is depressurized (depressurizing step). Specifically, the interior of the buffer tank 80 and the interior of the film-forming raw material tank 91 are exhausted by the exhaust mechanism 42 via the evac line 104 by opening the opening/closing valves 105, 106, 96a, and 96b while closing the opening/closing valves 99, 95a, 95b, and 103. Thus, the interior of the buffer tank 80, the interior of the film-forming raw material tank 91, and the $WCl_6$ gas supply line 61 are depressurized. At this time, the interior of the film-forming raw material tank 91 may be depressurized to a vacuum state by the exhaust mechanism 42, and the internal pressure of the buffer tank 80 detected by the manometer 80a may be depressurized until it reaches a predetermined pressure. The predetermined pressure may be equal to or higher than the internal pressure of the processing vessel 1 so that the gas does not flow back from the interior of the processing vessel 1 to the $WCl_6$ gas supply line 61 when opening the opening/closing valve 73. Further, the predetermined pressure may be substantially the same as the internal pressure of the processing vessel 1. The substantially same pressure as the internal pressure of the processing vessel 1 means the same pressure as the internal pressure of the processing vessel 1 and a pressure within a range of the same pressure ±10%. As a method of depressurizing the interior of the buffer tank 80 to a predetermined pressure, for example, there may be a method of controlling a period of time during which the interior of the buffer tank 80 is exhausted by the exhaust mechanism 42 or a method of controlling the degree of opening of the pressure control valve 107. In the present embodiment, as illustrated in FIG. 4, the internal pressure of the buffer tank 80 is reduced to 30 Torr ($4.0 \times 10^3$ Pa). After the internal pressure of the buffer tank 80 is reduced to a predetermined pressure, the opening/closing valves 105 and 106 are closed and the opening/closing valves 95a, 95b, and 103 are opened. Thus, the buffer tank 80 is filled with the $N_2$ gas supplied from the carrier $N_2$ gas supply source 93, the $WCl_6$ gas supplied from the film-forming raw material tank 91, and the $N_2$ gas supplied from the dilution $N_2$ gas supply line 100, so that the internal pressure of the buffer tank 80 gradually increases.

Subsequently, as illustrated in FIG. 3B, a tungsten film 203 is formed on the base film 202 using the $WCl_6$ gas as a metal chloride gas and the $H_2$ gas as a reducing gas (film forming step). The film forming step is performed simultaneously when or immediately after the internal pressure of the buffer tank 80 reaches a predetermined pressure at the depressurizing step and the opening/closing valves 105 and 106 are closed. That is to say, the film forming step is started in the state where the internal pressure of the buffer tank 80 is reduced to a predetermined pressure. Thus, as illustrated in FIG. 4, the internal pressure of the buffer tank 80 is low during the initial stage of the film forming step, and the internal pressure of the buffer tank 80 gradually increases over time.

Figure 5:
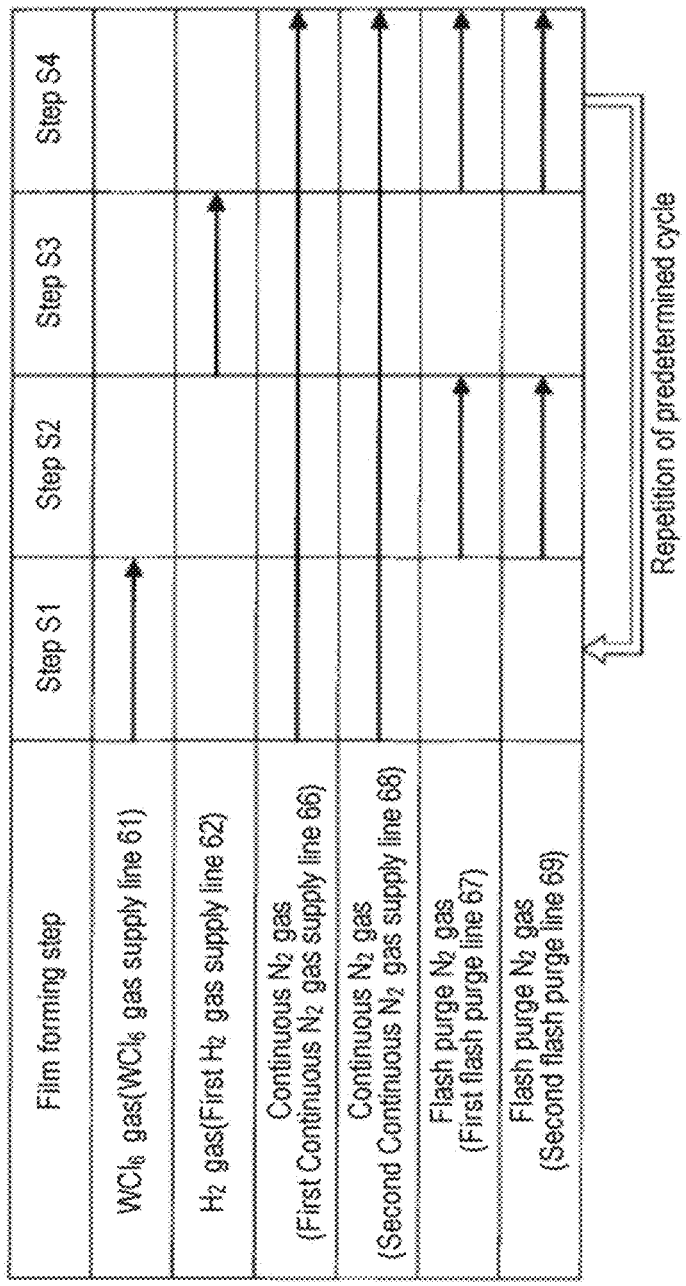
FIG. 5 is a diagram illustrating a gas supply sequence in a film forming step of the film forming method according to the present embodiment.

FIG. 5 is a diagram illustrating a gas supply sequence in the film forming step of the film forming method according to the present embodiment.

Step S1 is a raw material gas supply step of supplying a $WCl_6$ gas to the process space 37. In step S1, first, an $N_2$ gas is continuously supplied from the first $N_2$ gas supply source 54 and the second $N_2$ gas supply source 55 via the first continuous $N_2$ gas supply line 66 and the second continuous $N_2$ gas supply line 68 while opening the opening/closing valves 76 and 78. Furthermore, by opening the opening/closing valve 73, the $WCl_6$ gas is supplied from the $WCl_6$ gas supply mechanism 51 to the process space 37 in the processing vessel 1 via the $WCl_6$ gas supply line 61. At this time, the $WCl_6$ gas is temporarily stored in the buffer tank 80 and then supplied into the processing vessel 1. Also, in step S1, an $H_2$ gas may be supplied as an additive reducing gas into the processing vessel 1 via the second $H_2$ gas supply line 63 extending from the second $H_2$ gas supply source 53. By supplying the reducing gas together with the $WCl_6$ gas in step S1, the supplied $WCl_6$ gas is activated so that the film forming reaction in a subsequent step S3 is likely to occur. Therefore, it is possible to maintain high step coverage, and to increase a deposition rate by increasing a deposition film thickness per cycle. A flow rate of the additive reducing gas may be set at a flow rate to such an extent that the CVD reaction does not occur in step S1.

Step S2 is a purging step of purging an excess $WCl_6$ gas or the like in the process space 37. In step S2, the opening/closing valve 73 is closed to stop the supply of the $WCl_6$ gas while continuing to supply the $N_2$ gas via the first continuous $N_2$ gas supply line 66 and the second continuous $N_2$ gas supply line 68. Furthermore, the opening/closing valves 77 and 79 are opened, and the $N_2$ gas (flash purge $N_2$ gas) is also supplied from the first flash purge line 67 and the second flash purge line 69 so that the excess $WCl_6$ gas or the like in the process space 37 is purged by a large flow rate of the $N_2$ gas.

Step S3 is a reducing gas supply step of supplying an $H_2$ gas to the process space 37. In step S3, the opening/closing valves 77 and 79 are closed to stop the supply of the $N_2$ gas from the first flash purge line 67 and the second flash purge line 69. Furthermore, the opening/closing valve 74 is opened while continuing to supply the $N_2$ gas via the first continuous $N_2$ gas supply line 66 and the second continuous $N_2$ gas supply line 68. Thus, the $H_2$ gas is supplied as a reducing gas from the first $H_2$ gas supply source 52 to the process space 37 via the first $H_2$ gas supply line 62. At this time, the $H_2$ gas is temporarily stored in the buffer tank 81 and then supplied into the processing vessel 1. $WCl_6$ adsorbed onto the wafer W is reduced by step S3. A flow rate of the $H_2$ gas at this time may be set at a flow rate sufficient for the reduction reaction to occur.

Step S4 is a purging step of purging an excess $H_2$ gas in the process space 37. In step S4, the opening/closing valve 74 is closed to stop the supply of the $H_2$ gas from the first $H_2$ gas supply line 62 while continuing to supply the $N_2$ gas via the first continuous $N_2$ gas supply line 66 and the second continuous $N_2$ gas supply line 68. Furthermore, the opening/closing valves 77 and 79 are opened and the $N_2$ gas (flash purge $N_2$ gas) is also supplied from the first flash purge line 67 and the second flash purge line 69 so that, similar to step S2, the excess $H_2$ gas in the process space 37 is purged by a large flow rate of the $N_2$ gas.

The above steps S1 to S4 are carried out one cycle in a short period of time to form a thin tungsten unit film. The cycle of these steps is repeated a plurality of times to form a thin tungsten film of a desired film thickness. The film thickness of the tungsten film at this time may be controlled by the number of repetitions of the cycle. In the present embodiment, there has been described a case where the loading step, the depressurizing step, and the film forming step are performed in the named order as an example, but the loading step and the depressurizing step may be performed simultaneously.

In the present embodiment, the interior of the film-forming raw material tank 91 has been described to be depressurized (depressurizing step) prior to the film formation (film forming step) of the tungsten film 203. The reason for this is as follows.

Figure 6:
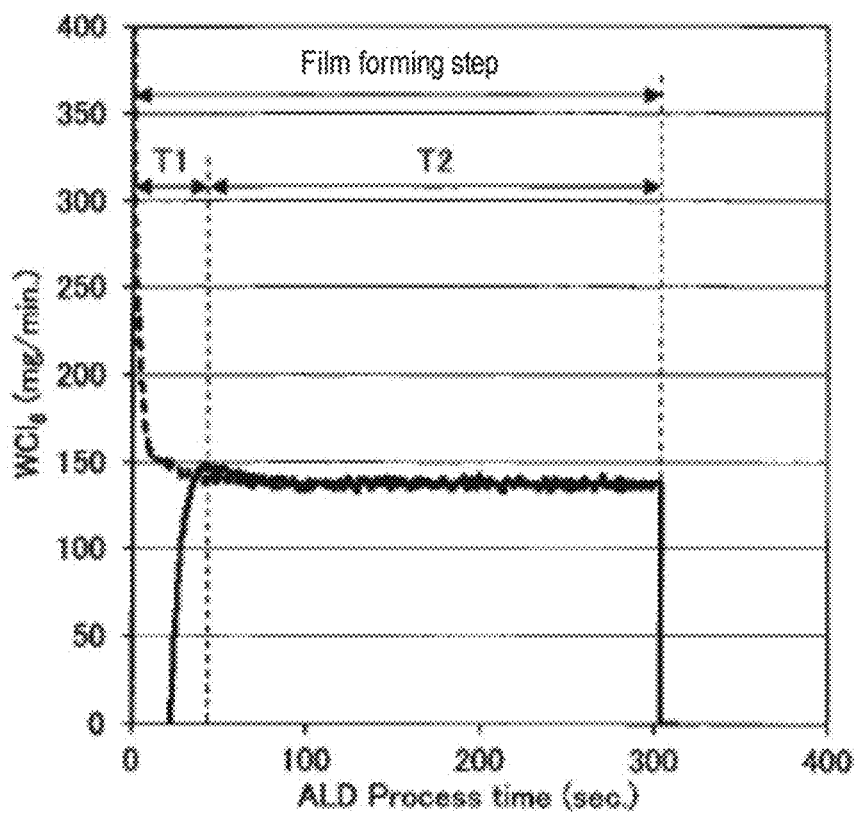
FIG. 6 is a diagram showing a relationship between an elapsed time after the start of the film forming step and a flow rate of a $WCl_6$ gas.

FIG. 6 is a diagram illustrating a relationship between an elapsed time after the start of the film forming step and a flow rate of the $WCl_6$ gas. In FIG. 6, the horizontal axis represents an elapsed time (sec) after the start of the film forming step, and the vertical axis represents a flow rate (mg/min) of the $WCl_6$ gas. Furthermore, in FIG. 6, the result obtained when the film forming step was performed after the depressurizing step is indicated by the solid line, and the result obtained when the film formation step was performed while bypassing the depressurizing step is indicated by the broken lines.

If the base film 202 is a titanium-based material film. e.g., a TiN film, when the $WCl_6$ gas is supplied in a state where the tungsten film 203 is hardly formed, the etching reaction occurs between the TiN film and the $WCl_6$ gas as expressed by the following equation Eq. (1).

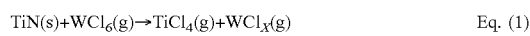

$$TiN(s)+WCl_6(g) \rightarrow TiCl_4(g)+WCl_X(g) \qquad \text{Eq. (1)}$$

Furthermore, the etching amount of the TiN film increases as the supply time and the flow rate of $WCl_6$ increase.

Therefore, a method for suppressing the etching reaction between the TiN film and the $WCl_6$ gas was studied. As a result, it was found that, as illustrated in FIG. 6, when the tungsten film 203 is formed on the TiN film, it is effective to set a period of time Ti during which the flow rate of the $WCl_6$ gas supplied once gradually increases, in the supply of the $WCl_6$ gas which is repeated a plurality of times. The period of time Ti during which the flow rate of the $WCl_6$ gas gradually increases may be a portion of the period of time during which the $WCl_6$ gas is repeatedly supplied a plurality of times, and may be also a period of time taken until a protective film for the TiN film is formed.

More specifically, for example, prior to forming the tungsten film 203, the interior of the film-forming raw material tank 91 is depressurized to a predetermined pressure and the film formation of the tungsten film 203 is started under the depressurized state. Thus, in the supply of the $WCl_6$ gas which is repeated a plurality of times (step S1), the period of time TI during which the flow rate of the $WCl_6$ gas supplied once gradually increases and a period of time T2 during which the flow rate of the $WCl_6$ gas supplied once is constant may be set. For the period of time TI during which the flow rate of the $WCl_6$ gas supplied once gradually increases, the $WCl_6$ gas is supplied in the state where the tungsten film 203 is hardly formed, but since the flow rate of the $WCl_6$ gas is small, the TiN film is hardly etched. Furthermore, although the flow rate of the $WCl_6$ gas increases over time, at this time, since the tungsten film 203 is formed on the surface of the TiN film, the $WCl_6$ gas does not directly act on the TiN film. Therefore, it is possible to suppress the etching reaction of the TiN film by the $WCl_6$ gas.

On the other hand, when the film formation of the tungsten film is started without depressurizing the interior of the film-forming raw material tank 91 before forming the tungsten film, as indicated by the broken lines in the FIG. 6, the flow rate of the $WCl_6$ gas supplied once increases in the initial stage of the film forming step. Therefore, the TiN film may be etched by the $WCl_6$ gas, which may be thinner than the required film thickness.

Example 1

In Example 1, a TiN film was formed as a base film on a surface of a wafer, and a tungsten film was formed using the film forming method according to the present embodiment by the film forming apparatus shown in FIG. 1. The processing conditions are as follows.

(Depressurizing Step)

Internal pressure of buffer tank: 28 Torr (3,733 Pa)

(Film Forming Step)

Temperature of wafer: 550 degrees C.

Internal pressure of processing vessel: 35 Torr ($4.7 \times 10^3$ Pa)

Flow rate of $WCl_6$ gas: 140 mg/min

Time period of step S1: 0.3 sec

Time period of step S2: 0.2 sec

Time period of step S3: 0.3 sec

Time period of step S4: 0.2 sec

Number of cycles: 150 cycles

Furthermore, as a Comparative example, a tungsten film was formed by the same step as in the Example except that the depressurizing step was not performed. The processing conditions are as follows.

(Film Forming Step)

Temperature of wafer: 550 degrees C.

Internal pressure of processing vessel: 35 Torr ($4.7 \times 10^3$ Pa)

Flow rate of $WCl_6$ gas: 140 mg/min

Time period of step S1: 0.3 sec

Time period of step S2: 0.2 sec

Time period of step S3: 0.3 sec

Time period of step S4: 0.2 sec

Number of cycles: 150 cycles

The following table 1 shows the measurement results of an etching amount of a TiN film available when a tungsten film was formed in the Example and the Comparative example.

|  | Example | Comparative example |
| --- | --- | --- |
| Depressurizing step | Performed | Not performed |
| Etching amount of TiN film | 1.3 nm | 1.6 nm |

As shown in the above Table, when the interior of the buffer tank was depressurized (depressurizing step) and thereafter a tungsten film was formed (film forming step), the etching amount of the TiN film was 1.3 nm. On the other hand, the etching amount of the TiN film was 1.6 nm when a tungsten film was formed (film forming step) without depressurizing (depressurizing step) the interior of the buffer tank. That is to say, by depressurizing the interior of the buffer tank to a predetermined pressure and then forming a tungsten film, it is possible to suppress etching of the TiN film as the base film 202 by the $WCl_6$ gas.

Example 2

In Example 2, a TiN film was formed as a base film on a surface of a wafer on which a hole is formed, and a tungsten film was formed using the film forming method according to the present embodiment by the film forming apparatus shown in FIG. 1. The processing conditions are as follows.
(Depressurizing Step)
    Internal pressure of buffer tank: 28 Torr (3,733 Pa)
(Film Forming Step)
    Temperature of wafer: 550 degrees C.
    Internal pressure of processing vessel: 35 Torr ($4.7 \times 10^3$ Pa) Flow rate of $WCl_6$ gas: 140 mg/min
    Time period of step S1: 0.3 sec
    Time period of step S2: 0.2 sec
    Time period of step S3: 0.3 sec
    Time period of step S4: 0.2 sec
    Number of cycles: 150 cycles
    Furthermore, as a Comparative example, a tungsten film was formed by dividing the film forming step into two steps (a first film forming step and a second film forming step) with different flow rates of the $WCl_6$ gas without performing the depressurizing step. The processing conditions are as follows.
(First Film Forming Step)
    Temperature of wafer: 550 degrees C.
    Internal pressure of processing vessel: 35 Torr ($4.7 \times 10^3$ Pa)
    Flow rate of $WCl_6$ gas: 60 mg/min
    Time period of step S1: 0.3 sec
    Time period of step S2: 0.2 sec
    Time period of step S3: 0.3 sec
    Time period of step S4: 0.2 sec
    Number of cycles: 50 cycles
(Second Film Forming Step)
    Temperature of wafer: 550 degrees C.
    Internal pressure of processing vessel: 35 Torr ($4.7 \times 10$ Pa)
    Flow rate of $WCl_6$ gas: 140 mg/min
    Time period of step S1: 0.3 sec
    Time period of step S2: 0.2 sec
    Time period of step S3: 0.3 sec.
    Time period of step S4: 0.2 sec
    Number of cycles: 100 cycles
    FIG. 7 is a diagram illustrating step coverage of the tungsten film in the Example and the Comparative example. In FIG. 7, the left figure represents a scanning electron microscope (SEM) image of a cross section of the tungsten film in the Example, and the right figure represents an SEM image of a cross section of the tungsten film in the Comparative example. Furthermore, the upper stage and the lower stage in FIG. 7 indicate a top position and a bottom position of a hole, respectively.

As shown in FIG. 7, when the interior of the buffer tank was depressurized (depressurizing step) and thereafter a tungsten film was formed (film forming step), both the film thickness of the tungsten film at the top position and the film thickness of the tungsten film at the bottom position were 6.9 nm which is the same. That is to say, the step coverage (the bottom film thickness/the top film thickness) was 1.0.

On the other hand, when a tungsten film was formed by dividing the film forming step into two steps with different flow rates of the $WCl_6$ gas without depressurizing the interior of the buffer tank, the film thicknesses of the tungsten film at the top position and the bottom position was 10.9 nm and 7.9 nm, respectively. That is to say, the step coverage was 0.72.

By depressurizing the interior of the buffer tank and then forming the tungsten film in this manner, it is possible to obtain high step coverage.

While the embodiment for implementing the present disclosure has been described above, the above contents are not intended to limit the content of the disclosure and may be differently modified and reformed within the scope of the present disclosure.

In the aforementioned embodiment, there has been described a case where the flow rate of the $WCl_6$ gas gradually increases by gradually increasing the internal pressure of the buffer tank as an example, but the present disclosure is not limited thereto. For example, the flow rate of the $WCl_6$ gas may gradually increase by gradually increasing a flow rate of an $N_2$ gas supplied from the carrier $N_2$ gas supply source 93 with respect to a flow rate of an $N_2$ gas supplied from the dilution $N_2$ gas supply source 101.

Furthermore, in the aforementioned embodiment, there has been described a case where the tungsten film is formed using the $WCl_6$ gas as the metal chloride gas as an example. However, the present disclosure may be applied so long as a metal film is formed by alternately supplying a metal chloride gas and a reducing gas a plurality of times. As the metal chloride gas, it may be possible to use other tungsten chloride gas such as a $WCl_5$ gas, and even when the $WCl_5$ gas is used, it shows substantially the same behavior as the $WCl_6$ gas. In addition, for example, even when a molybdenum film is formed using a molybdenum chloride gas and a reducing gas, or even when a tantalum film is formed using a tantalum chloride gas and a reducing gas, the present disclosure may also be applied.

Moreover, in the aforementioned embodiment, there has been described a case where the $H_2$ gas is used as the reducing gas as an example. However, any reducing gas may be used so long as it contains hydrogen, and an $SiH_4$ gas, a $B_2H_6$ gas, an $NH_3$ gas, or the like, in addition to the $H_2$ gas, may be used. Two or more of the $H_2$ gas, the $SiH_4$ gas, the $B_2H_6$ gas, and the $NH_3$ gas may be supplied. Also, reducing gases other than these gases, for example, a $PH_3$ gas or an $SiH_2Cl_2$ gas, may be used. From the viewpoint of obtaining a low resistance value by further reducing an impurity in a film, the $H_2$ gas may be used. Also, other inert gases such as an Ar gas may be used as a purge gas and a carrier gas instead of the $N_2$ gas.

In addition to the aforementioned embodiment, there has been described a case where the semiconductor wafer is used as the substrate as an example, but the semiconductor wafer may be a silicon wafer, or may be a compound semiconductor wafer of GaAs, SiC, GaN, and the like. Furthermore, the substrate is not limited to the semiconductor wafer and the present disclosure may be applied to a glass substrate used for a flat panel display (FPD) such as a liquid crystal display device, a ceramic substrate, and the like.

According to the present disclosure in some embodiments, it is possible to form a metal film while suppressing etching of a base film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method of forming a metal film comprising:
   supplying a metal chloride gas to a buffer tank;
   after supplying the metal chloride gas to the buffer tank, depressurizing an interior of the buffer tank to which the metal chloride gas is supplied, to a predetermined pressure; and
   immediately after the depressurizing, forming a metal film on a substrate by repeating, a plurality of times, a cycle of alternately supplying the metal chloride gas and a reducing gas for reducing the metal chloride gas to the substrate arranged inside a processing vessel,
   wherein the alternately supplying the metal chloride gas and the reducing gas includes a period of time during which a flow rate of the metal chloride gas gradually increases.

2. The method of claim 1, wherein the alternately supplying the metal chloride gas and the reducing gas further includes an additional period of time during which a flow rate of the metal chloride gas gradually increases.

3. The method of claim 2, wherein the alternately supplying the metal chloride gas and the reducing gas further includes a period of time during which a flow rate of the metal chloride gas is constant.

4. The method of claim 3, wherein the period of time during which the flow rate of the metal chloride gas is constant is set after the period of time during which the flow rate of the metal chloride gas gradually increases.

5. The method of claim 1, wherein a flow rate of the reducing gas is constant.

6. The method of claim 1, wherein the buffer tank is installed in a supply line through which the metal chloride gas is supplied into the processing vessel, and
   the period of time during which the flow rate of the metal chloride gas gradually increases is set by gradually increasing an internal pressure of the buffer tank.

7. The method of claim 1, wherein the predetermined pressure is substantially the same as an internal pressure of the processing vessel.

8. The method of claim 1, wherein the substrate includes a base film formed thereon, and
   the period of time during which the flow rate of the metal chloride gas gradually increases is a period of time taken until a protective film for the base film is formed.

9. The method of claim 8, wherein the base film is a titanium-based material film.

10. The method of claim 1, wherein the metal chloride gas is a tungsten chloride gas.

11. The method of claim 10, wherein the tungsten chloride gas is a $WCl_5$ gas or a $WCl_6$ gas.

12. The method of claim 1, wherein the reducing gas is an $H_2$ gas.

* * * * *